(12) United States Patent
Gustafsson

(10) Patent No.: US 7,724,173 B2
(45) Date of Patent: May 25, 2010

(54) TIME-INTERLEAVED ANALOG-TO-DIGITAL-CONVERTER

(75) Inventor: Staffan Gustafsson, Linkoping (SE)

(73) Assignee: Zoran Corporation, Sunnyvale, CA (US)

( * ) Notice: Subject to any disclaimer, the term of this patent is extended or adjusted under 35 U.S.C. 154(b) by 89 days.

(21) Appl. No.: 12/279,374

(22) PCT Filed: Jan. 18, 2007

(86) PCT No.: PCT/EP2007/050508

§ 371 (c)(1),
(2), (4) Date: Aug. 14, 2008

(87) PCT Pub. No.: WO2007/093478

PCT Pub. Date: Aug. 23, 2007

(65) Prior Publication Data

US 2009/0021412 A1    Jan. 22, 2009

(30) Foreign Application Priority Data

Feb. 17, 2006    (EP) .................................. 06110116

(51) Int. Cl.
*H03M 1/36* (2006.01)

(52) U.S. Cl. .................. 341/159; 341/118; 341/120; 341/141; 341/155; 341/161

(58) Field of Classification Search .................. 341/118, 341/120, 141, 155, 159, 161
See application file for complete search history.

(56) References Cited

U.S. PATENT DOCUMENTS 4,968,988 A    11/1990   Miki et al.
5,239,299 A *   8/1993   Apple et al. ................. 341/118

(Continued)

FOREIGN PATENT DOCUMENTS

EP    1 401 105 A1    3/2004

(Continued)

OTHER PUBLICATIONS

International Search Report corresponding to PCT/EP2007/050508, mailing date of Apr. 26, 2007.

(Continued)

*Primary Examiner*—Linh V Nguyen
(74) *Attorney, Agent, or Firm*—Renner, Otto, Boisselle & Sklar, LLP

(57) ABSTRACT

A method for operating a time-interleaved analog-to-digital converter for converting an analog input to a digital output using a time-interleaved analog-to-digital converter, wherein the time-interleaved analog-to-digital converter comprises an array of M sub ADCs ($ADC_1, ADC_2, \ldots, ADC_M$), where M is an even integer, and each row of the array comprises one of the M sub ADCs. The method comprises the step of, for every sampling instant n, where n is an integer in a sequence of integers, converting the analog input by means of the sub ADC in row k(n) of the array, wherein $1 \leq k(n) \leq M$. A value between 1 and M is assigned to k(n) for the first sample instant, and k(n+1) is selected such that a) $k(n+1) > M/2$ if $k(n) \leq M/2$, otherwise $k(n+1) \leq M/2$; b) $M/2-1 \leq |k(n+1)-k(n)| \leq M/2+1$; and c) $k(n+1) = k(m+1)$ if and only if n−m is an integer multiple of M. A time interleaved analog-to-digital converter operating in accordance with the method is also disclosed.

14 Claims, 7 Drawing Sheets

U.S. PATENT DOCUMENTS

| | | | |
|---|---|---|---|
| 5,294,926 A | 3/1994 | Corcoran | |
| 6,522,282 B1* | 2/2003 | Elbornsson | 341/155 |
| 6,809,668 B2* | 10/2004 | Asami | 341/120 |
| 6,982,664 B1* | 1/2006 | Nairn | 341/118 |
| 7,012,559 B1* | 3/2006 | Pan et al. | 341/161 |
| 7,049,984 B2* | 5/2006 | Wood et al. | 341/120 |
| 7,084,793 B2* | 8/2006 | Elbornsson | 341/118 |
| 7,161,514 B2* | 1/2007 | Tamba | 341/120 |
| 7,196,650 B1* | 3/2007 | Hand et al. | 341/155 |
| 7,253,762 B2* | 8/2007 | Huang et al. | 341/155 |
| 7,283,074 B2* | 10/2007 | Sheng et al. | 341/120 |
| 7,394,415 B2* | 7/2008 | Fuse et al. | 341/120 |
| 7,538,708 B2* | 5/2009 | Xu | 341/155 |

FOREIGN PATENT DOCUMENTS

WO    WO 00/72447  A1    11/2000

OTHER PUBLICATIONS

Jenq, Y C; Digital spectra of non-uniformly sampled signals; theories and applications. III. A robust sampling time offset estimation algorithm for ultra high speed waveform digitizers using interleaving: Conference Proceedings Article, Apr. 25, 1989, pp. 208-212.

* cited by examiner

TIME-INTERLEAVED ANALOG-TO-DIGITAL-CONVERTER

TECHNICAL FIELD OF THE INVENTION

The present invention relates to a time-interleaved analog-to-digital converter. It also relates to a method for controlling the time-interleaved analog-to-digital converter.

DESCRIPTION OF RELATED ART

A time-interleaved (TI) analog-to-digital converter (ADC) utilizes a plurality of sub ADCs with a common analog input. The plurality of sub ADCs operate at a common first clock frequency or sampling frequency. A multi-phase clock unit is used to generate individual clock signals for each sub ADC. The individual clock signals generated by the multi-phase clock unit are mutually displaced in time, so as to achieve effective sampling for the TI-ADC at a second clock frequency or sampling frequency which is higher than the first clock frequency or sampling frequency with a factor equal to the number of sub ADCs in the TI-ADC.

The sub ADCs in a TI-ADC are normally operated in an order corresponding to their physical placement on a chip. For example, the sub ADCs may be physically arranged in an array with one sub ADC in each row. The sub ADCs may be operated starting with the sub ADC in the first row followed by the second row (which is placed adjacent to the first row), followed by the third row (which is placed adjacent to the second row), etc., until the last row is reached, whereupon the first row is used again.

Offset errors in the sub ADCs contribute to distortion, such as spurious tones, in the output of the TI-ADC. To some extent, such offset errors may be compensated for by applying digital signal processing (DSP) either to individual digital outputs of the sub ADCs or to a combined output of the TI-ADC. Such compensation requires DSP circuitry, which adds an undesired portion to the circuit area and power consumption of the TI-ADC. Hence, such arrangements for reducing the influence of offset errors may be complex.

SUMMARY OF THE INVENTION

It is an object of the present invention to provide a TI-ADC with reduced susceptibility to offset errors. It is a further object of the present invention to provide a TI-ADC with reduced complexity.

According to a first aspect, a method is provided for operating a time-interleaved analog-to-digital converter for converting an analog input to a digital output using a time-interleaved analog-to-digital converter, wherein the time-interleaved analog-to-digital converter comprises an array of M sub ADCs, where M is an even integer, and each row of the array comprises one of the M sub ADCs. The method comprises the step of, for every sampling instant n, where n is an integer in a sequence of integers, converting the analog input by means of the sub ADC in row $k(n)$ of the array, wherein $1 \leq k(n) \leq M$, a value between 1 and M is assigned to $k(n)$ for the first sampling instant, and $k(n+1)$ is selected such that a) $k(n+1) > M/2$ if $k(n) \leq M/2$, otherwise $k(n+1) \leq M/2$;
b) $M/2-1 \leq |k(n+1)-k(n)| \leq M/2+1$; and
c) $k(n+1) = k(m+1)$ if and only if $n-m$ is an integer multiple of M.

The value of $k(n+1)$ may be chosen according to
if $k(n) < M/2$ and $k(n)$ is odd, then $k(n+1) = k(n) + M/2 + 1$;
if $k(n) = M/2$ and $k(n)$ is odd, then $k(n+1) = M$;
if $k(n) \leq M/2$ and $k(n)$ is even, then $k(n+1) = k(n) + M/2 - 1$;
if $k(n) = M/2+1$, then $k(n+1) = 1$;
if $k(n) > M/2+1$ and $k(n) - M/2$ is odd, then $k(n+1) = k(n) - M/2 - 1$;
if $k(n) = M$ and $k(n) - M/2$ is even, then $k(n+1) = M/2$; or
if $M/2+1 < k(n) < M$ and $k(n) - M/2$ is even, then $k(n+1) = k(n) - M/2 + 1$.

Alternatively, if $M/2$ is an odd number, $k(n+1)$ may be chosen according to
if $k(n) = 1$ then $k(n+1)$ is set to $M/2+1$;
if $k(n) \leq M/2$, $k(n) \neq 1$, and $k(n)$ is odd, then $k(n+1)$ is set to $k(n) + M/2 - 1$;
if $k(n) \leq M/2$ and $k(n)$ is even, then $k(n+1)$ is set to $k(n) + M/2 + 1$;
if $k(n) = M$ then $k(n+1)$ is set to $M/2$;
if $M/2 < k(n) < M$ and $k(n)$ is odd, then $k(n+1)$ is set to $k(n) - M/2 - 1$; or
if $M/2 < k(n) < M$ and $k(n)$ is even, then $k(n+1)$ is set to $k(n) - M/2 + 1$.

According to a second aspect, a computer program product comprises computer program code means for executing the method when said computer program code means are run by an electronic device having computer capabilities.

According to a third aspect, a computer readable medium has stored thereon a computer program product comprising computer program code means for executing the method when said computer program code means are run by an electronic device having computer capabilities.

According to a fourth aspect, a time-interleaved analog-to-digital converter comprising an array of M sub ADCs, where M is an even integer, wherein each row of the array comprises one of the M sub ADCs is provided. The time-interleaved analog-to-digital converter comprises a control unit arranged to, for every sampling instant n, where n is an integer in a sequence of integers, select the sub ADC in row $k(n)$, $1 \leq k(n) \leq M$, of the array that is used for converting an analog input to a digital output. The control unit is adapted to assign a value between 1 and M to $k(n)$ for the first sampling instant and to, for a given value of $k(n)$, select $k(n+1)$ such that a) $k(n+1) > M/2$ if $k(n) \leq M/2$, otherwise $k(n+1) \leq M/2$;
b) $M/2-1 \leq |k(n+1)-k(n)| \leq M/2+1$; and
c) $k(n+1) = k(m+1)$ if and only if $n-m$ is an integer multiple of M.

The control unit may be arranged to select $k(n+1)$ according to
if $k(n) < M/2$ and $k(n)$ is odd, then $k(n+1)$ is set to $k(n) + M/2 + 1$;
if $k(n) = M/2$ and $k(n)$ is odd, then $k(n+1)$ is set to M;
if $k(n) \leq M/2$ and $k(n)$ is even, then $k(n+1)$ is set to $k(n) + M/2 - 1$;
if $k(n) = M/2+1$, then $k(n+1)$ is set to 1;
if $k(n) > M/2+1$ and $k(n) - M/2$ is odd, then $k(n+1)$ is set to $k(n) - M/2 - 1$;
if $k(n) = M$ and $k(n) - M/2$ is even, then $k(n+1)$ is set to $M/2$; or
if $M/2+1 < k(n) < M$ and $k(n) - M/2$ is even, then $k(n+1)$ is set to $k(n) - M/2 + 1$.

If $M/2$ is an odd number, the control unit may be arranged to select $k(n+1)$ according to
if $k(n) = 1$ then $k(n+1)$ is set to $M/2+1$;
if $k(n) \leq M/2$, $k(n) \neq 1$, and $k(n)$ is odd, then $k(n+1)$ is set to $k(n) + M/2$;
if $k(n) \leq M/2$ and $k(n)$ is even, then $k(n+1)$ is set to $k(n) + M/2 + 1$;
if $k(n) = M$ then $k(n+1)$ is set to $M/2$;
if $M/2 < k(n) < M$ and $k(n)$ is odd, then $k(n+1)$ is set to $k(n) - M/2 - 1$; or if M/2<k(n)<M and k(n) is even, then k(n+1) is set to k(n)−M/2+1.

The control unit may comprise a multi-phase clock unit arranged to generate an individual clock signal at each of a plurality of clock terminals of the multi-phase clock unit. Each of said plurality of clock terminals may be connected to one of the sub ADCs.

The multi-phase clock unit may include a delay-locked loop and/or a plurality of delay elements connected in a ring.

According to a fifth aspect, an integrated circuit comprises the time-interleaved ADC.

According to a sixth aspect, an electronic apparatus comprises the time-interleaved ADC. The electronic apparatus may be but is not limited to a monitor, a projector, a television set, or a radio transceiver.

Further embodiments of the invention are defined in the dependent claims.

It is an advantage of some embodiments that a large fraction of the signal power or energy of an error in the output of the time-interleaved ADC caused by offset errors may appear at the Nyquist frequency of the time-interleaved ADC where it can be removed by filtering. As a consequence, the need for compensating for offset errors using complex digital signal processing may be reduced or eliminated, which is a further advantage.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION OF EMBODIMENTS

Figure 1:
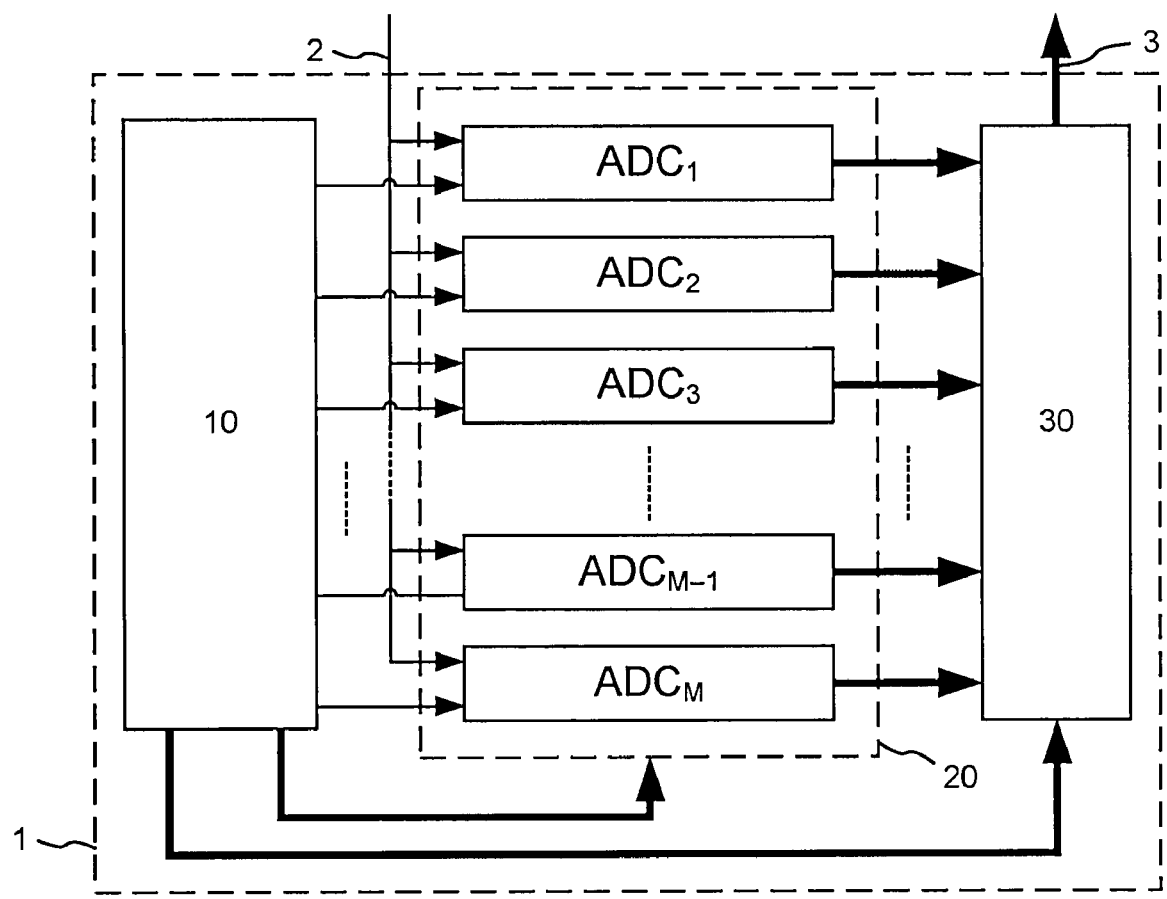
FIG. 1 is a block diagram of a TI-ADC according to an embodiment.

FIG. 1 shows a block diagram of a time-interleaved (TI) analog-to-digital converter (ADC) 1 according to an embodiment. The TI-ADC 1 may comprise an array 20 of M sub ADCs $ADC_1, \ldots, ADC_M$, where M may be an even integer. Each row of the array 20 may comprise exactly one of the sub ADCs $ADC_1, \ldots, ADC_M$, as indicated in FIG. 1. The placement of sub ADCs in FIG. 1 reflects the physical placement of sub ADCs on a chip or integrated circuit, i.e. $ADC_1$ may be placed in a first row of the array, $ADC_2$ may be placed in a second row adjacent to the first row, etc., and $ADC_M$ may be placed in a last row of the array. Each of the sub ADCs $ADC_1, \ldots, ADC_M$ operate at a common first clock frequency or sampling frequency. Sampling instants of the sub ADCs $ADC_1, \ldots, ADC_M$ are mutually displaced in time, so as to achieve effective sampling of the TI-ADC 1 at a second clock frequency or sampling frequency, which is higher than the first clock frequency or sampling frequency with a factor equal to the number M of sub ADCs $ADC_1, \ldots, ADC_M$.

The TI-ADC may comprise a control unit 10. The control unit 10 may be adapted to control the order in which the sub ADCs $ADC_1, \ldots, ADC_M$ are used. The control unit 10 may additionally be adapted to generate common clock signals and individual clock signals for the sub ADCs $ADC_1, \ldots, ADC_M$. The control unit 10 may further be adapted to generate control signals for a selector unit 30. Outputs of the sub ADCs $ADC_1, \ldots, ADC_M$ may be operatively connected to the selector unit 30. The selector unit 30 may be adapted to select one of the outputs of the sub ADCs $ADC_1, \ldots, ADC_M$ and forward the selected output to an output 3 of the TI-ADC 1. The selection may be based on the control signals supplied to the selector unit 30 by the control unit 10.

An offset error of a sub ADC $ADC_1, \ldots, ADC_M$ may be modeled with a constant added to the input of said sub ADC $ADC_1, \ldots, ADC_M$. Offset errors may e.g. show an approximately linear variation over the array 20, e.g. due to so called parameter gradients for circuit elements such as transistors and resistors. Operating or using the sub ADCs $ADC_1, \ldots, ADC_M$ in a straightforward order such that if a sample is converted by $ADC_k$, the following sample is converted by $ADC_{k+1}$ for k=1, 2, . . . , M−1, and if a sample is converted by $ADC_M$, the following sample is converted by $ADC_1$ in such a situation may result in a large amount of distortion in a signal band or Nyquist band of the TI-ADC.

According to an embodiment of the invention, the need for complex digital signal processing for compensating for offset errors may be reduced or eliminated using a method for controlling the TI-ADC 1 that provides a modified order of operating the sub ADCs $ADC_1, \ldots, ADC_M$. In the following, $ADC_{k(n)}$, which is placed in row k(n) of the array 20, denotes the sub ADC that is used to convert the analog input at the sample instant n. The sequence k(n) determines the order in which the sub ADCs $ADC_1, \ldots, ADC_M$ are used. For example, if k(n)=1, then $ADC_1$ is used to convert the analog input at sample instant n, if k(n)=2, then $ADC_2$ is used to convert the analog input at sample instant n, etc. An arbitrary or predefined value may be assigned to k(n) for the first or initial sample instant. Further, for every n, given a value of k(n), k(n+1) may be chosen such that a) k(n+1)>M/2 if k(n)≦M/2, otherwise k(n+1)≦M/2;
b) M/2−1≦|k(n+1)−k(n)|≦M/2+1; and
c) k(n+1)=k(m+1) if and only if m−n is an integer multiple of M.

The condition c) ensures that each sub ADC $ADC_1, \ldots, ADC_M$ is used to convert every M:th sample of the analog input. Conditions a) and b) results in that the sequence k(n) has an oscillating or toggling component with approximate amplitude of M/4. For example, for a TI-ADC where the offset errors has an approximately linear variation over the array 20, this results in that the distortion due to the offset errors has a spectral distribution such that a relatively large fraction of the total distortion energy is located at a frequency corresponding to half the sampling frequency, i.e. at the Nyquist frequency, of the TI-ADC 1. Said fraction of the total distortion energy may be removed using a linear filter, e.g a low-pass filter. The complexity of said linear filter may be reduced using oversampling. Hence, the need for complex digital signal processing to compensate for the offset errors may be reduced. Consequently, the complexity of the TI-ADC may be reduced.

Figure 2A:
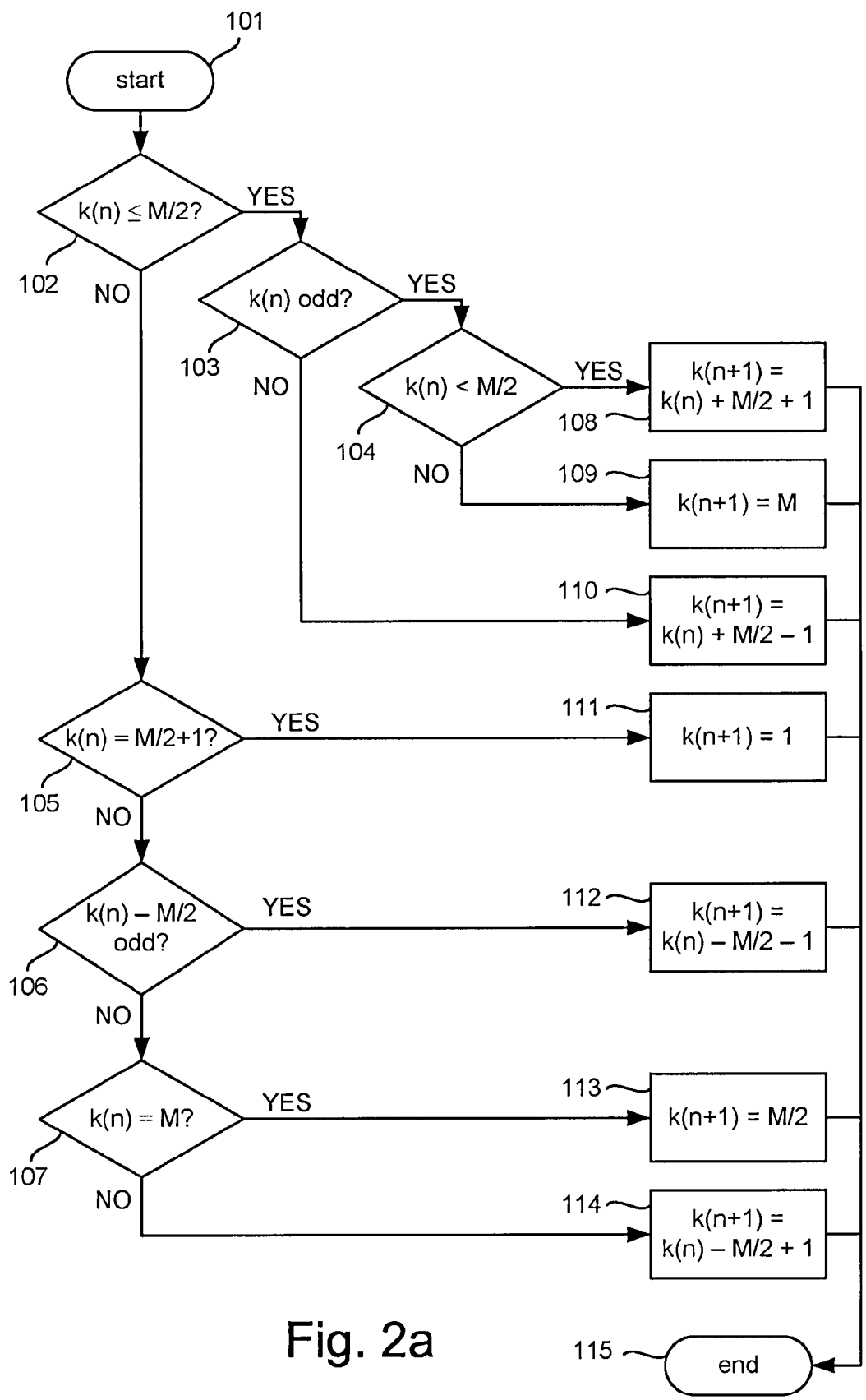
FIGS. 2a and b are flow charts for controlling the order of operation of sub ADCs in a TI-ADC according to embodiments.

An embodiment of the method is illustrated with a flow chart in FIG. 2a. For every value of n, given a value of k(n), k(n+1) may be chosen according to if k(n)<M/2 and k(n) is odd, then k(n+1) is set to k(n)+M/2+1 in step 108;

if k(n)=M/2 and k(n) is odd, then k(n+1) is set to M in step 109;

if k(n)≦M/2 and k(n) is even, then k(n+1) is set to k(n)+M/2−1 in step 110;

if k(n)=M/2+1, then k(n+1) is set to 1 in step 111;

if k(n)>M/2+1 and k(n)−M/2 is odd, then k(n+1) is set to k(n)−M/2−1 in step 112;

if k(n)=M and k(n)−M/2 is even, then k(n+1) is set to M/2 in step 113; or if M/2+1<k(n)<M and k(n)−M/2 is even, then k(n+1) is set to k(n)−M/2+1 in step 114.

Examples of the order in which the sub ADCs $ADC_1, \ldots, ADC_M$ may be operated according to the flow chart of FIG. 2a are given below for a few different values of M. The sub ADCs $ADC_1, \ldots, ADC_M$ are operated cyclically with a cycle that repeats itself every M:th sample. Only one cycle is shown in the examples.

M=2:
$ADC_1, ADC_2$

M=4:
$ADC_1, ADC_4, ADC_2, ADC_3$

M=6:
$ADC_1, ADC_5, ADC_3, ADC_6, ADC_2, ADC_4$

M=12:
$ADC_1, ADC_8, ADC_3, ADC_{10}, ADC_5, ADC_{12}, ADC_6, ADC_{11}, ADC_4, ADC_9, ADC_2, ADC_7$

M=14:
$ADC_1, ADC_9, ADC_3, ADC_{11}, ADC_5, ADC_{13}, ADC_7, ADC_{14}, ADC_6, ADC_{12}, ADC_4, ADC_{10}, ADC_2, ADC_8$

Figure 2B:
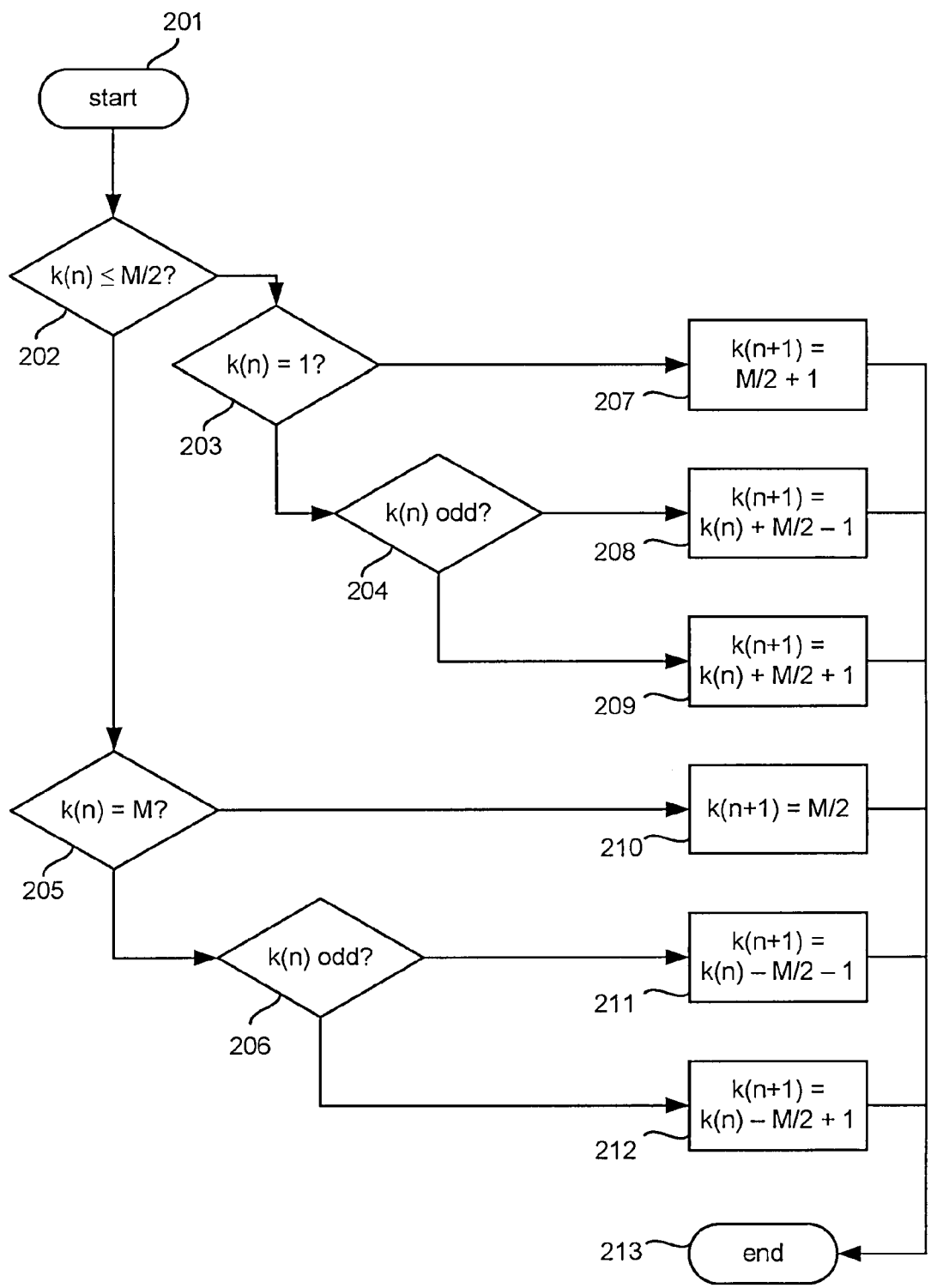

Alternatively, if M/2 is an odd number, the order in which the sub ADCs $ADC_1, \ldots, ADC_M$ are operated may be selected in an order given by the flow chart in FIG. 2b. Then, for every value of n, given a value of k(n), k(n+1) may be chosen according to if k(n)=1 then k(n+1) is set to M/2+1 in step 207;

if k(n)≦M/2, k(n)≠1, and k(n) is odd, then k(n+1) is set to k(n)+M/2−1 in step 208;

if k(n)≦M/2 and k(n) is even, then k(n+1) is set to k(n)+M/2+1 in step 209;

if k(n)=M then k(n+1) is set to M/2 in step 210;

if M/2<k(n)<M and k(n) is odd, then k(n+1) is set to k(n)−M/2−1 in step 211; or if M/2<k(n)<M and k(n) is even, then k(n+1) is set to k(n)−M/2+1 in step 212.

Using the embodiment according to the flow chart of FIG. 2b results in a reverse order of operation compared with using the embodiment according to the flow chart of FIG. 2a. For example, for M=14, the sub ADCs will be operated in the following order (showing one cycle of 14 samples).

$ADC_1, ADC_8, ADC_2, ADC_{10}, ADC_4, ADC_{12}, ADC_6, ADC_{14}, ADC_7, ADC_{13}, ADC_5, ADC_{11}, ADC_3, ADC_9$

An example showing the consequences of using the embodiment according to the flow chart of FIG. 2a will be given in the following. In the example, the offset errors are modeled with a linear variation over the array 20. The offset error o(k) associated with the sub ADC $ADC_k$ is modeled with $$o(k) = c_1\left(k - \frac{M+1}{2}\right) + c_2 = o_1(k) + c_2$$

where $c_1$ and $c_2$ are constants. The constant $c_2$ give rise to an overall DC offset of the TI-ADC 1. Such a DC offset may be ignored in some applications. Alternatively, it may be compensated for using a simple subtraction with a constant. Therefore, only the first term $o_1(k)$ of o(k) will be considered in the following. For a given sequence k(n) defining the order in which the sub ADCs $ADC_1, \ldots, ADC_M$ are used, a offset error sequence $o_1(k(n))$ will result. The offset errors have the same effect as if the offset error sequence $o_1(k(n))$ would be added to the samples of the analog input signal in an ADC without offset errors.

Figure 3A:
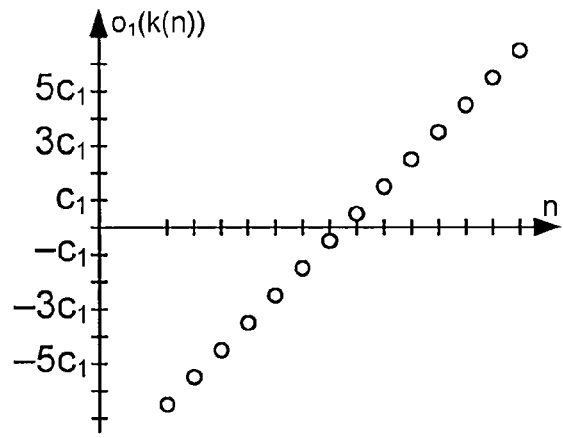
FIG. 3a is a graph of an offset error sequence resulting from a straightforward selection of the order of operation of sub ADCs in a TI-ADC when offset errors of the sub ADC vary linearly over an array of sub ADCs.

As an example, the case M=14 will be considered. First, if the sub ADCs $ADC_1, \ldots, ADC_M$ are operated in the straightforward order where the sequence k(n)= ..., 1, 2, 3, ..., 13, 14, 1, 2, ..., the resulting offset error sequence $o_1(k(n))$ will be as illustrated in FIG. 3a. Only one cycle of 14 samples of the repetitive offset error sequence $o_1(k(n))$ is shown in FIG. 3a.

Figure 3B:
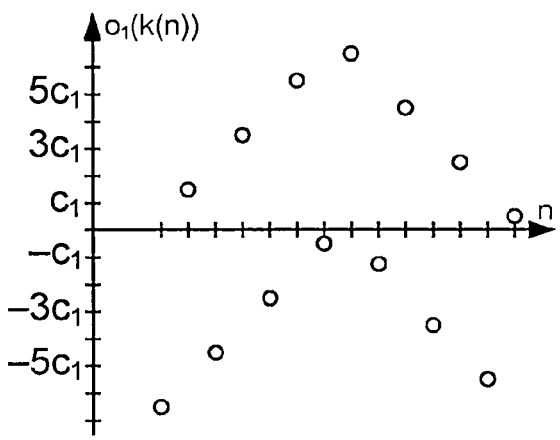
FIG. 3b is a graph of the offset error sequence resulting from a selection of the order of operation of sub ADCs in a TI-ADC according to the flow chart in FIG. 2a when offset errors of the sub ADC vary linearly over an array of sub ADCs.
Figure 3C:
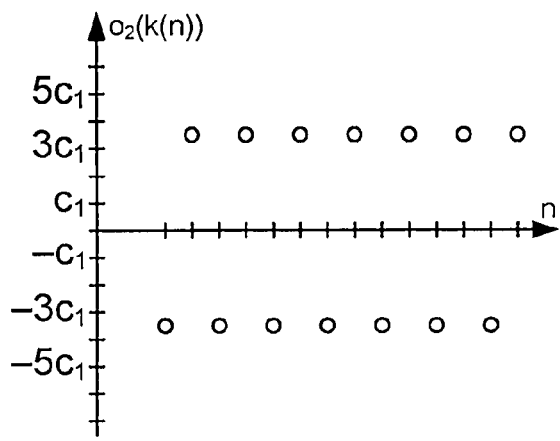
FIGS. 3c and d are graphs of a first and a second term of the offset error sequence shown in FIG. 3b, respectively.
Figure 3D:
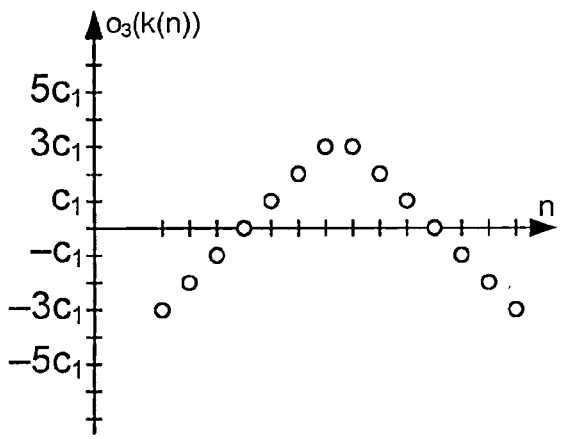

If the sequence k(n) is instead chosen according to the embodiment illustrated with the flow chart in FIG. 2a, the resulting offset error sequence $o_1(k(n))$ will be as illustrated in FIG. 3b. For this choice of the sequence k(n), i.e. k(n)= ..., 1, 8, 3, 10, 5, 12, 6, 11, 4, 9, 2, 7, 1, 8, 3, ..., the offset error sequence $o_1(k(n))$ may be decomposed into a sum of two sequences $o_2(n)$ and $o_3(n)$ illustrated in FIG. 3c and FIG. 3d, respectively. The sequence $o_2(n)$ is toggling or oscillating with a frequency corresponding to half the sampling frequency of the TI-ADC. Hence, it may be filtered out using a linear filter. Only the sequence $o_3(n)$ contribute to distortion at frequencies below the Nyquist frequency of the TI-ADC. As in FIG. 3a, FIGS. 3b-d show one cycle of 14 samples. The ratio between the total signal energies over a cycle of 14 samples for the offset error sequence $o_1(k(n))$ of FIG. 3a and the sequence $o_3(n)$ of FIG. 3d is 4.0625. Hence, using the method illustrated with the flow chart of FIG. 2a, the distortion energy at frequencies below the Nyquist frequency of the TI-ADC due to offset errors is approximately a factor four smaller than when the sub ADCs $ADC_1, \ldots, ADC_M$ are used in the straightforward order determined by k(n)= ..., 1, 2, 3, ..., 13, 14, 1, 2, ... for the considered example.

According to an embodiment, the control unit 10 may be arranged to, for every n, select the sub ADC $ADC_{k(n)}$ in row k(n), 1≦k(n)≦M, of the array 20 that is used for converting the analog input at the sample instant n by means of assigning an arbitrary or predefined value to k(n) for the first sample instant and selecting k(n+1) such that a) k(n+1)>M/2 if k(n)≦M/2, otherwise k(n+1)≦M/2;

b) M/2−1≦|k(n+1)−k(n)|≦M/2+1; and c) k(n+1)=k(m+1) if and only if n−m is an integer multiple of M.

For example, the control unit 10 may be arranged to select k(n+1) according to the flow chart of FIG. 2a, i.e.

if k(n)<M/2 and k(n) is odd, then k(n+1) is set to k(n)+M/2+1;

if k(n)=M/2 and k(n) is odd, then k(n+1) is set to M;

if k(n)≦M/2 and k(n) is even, then k(n+1) is set to k(n)+M/2−1;

if k(n)=M/2+1, then k(n+1) is set to 1;

if k(n)>M/2+1 and k(n)−M/2 is odd, then k(n+1) is set to k(n)−M/2−1;
if k(n)=M and k(n)−M/2 is even, then k(n+1) is set to M/2; or
if M/2+1<k(n)<M and k(n)−M/2 is even, then k(n+1) is set to k(n)−M/2+1.

Alternatively, if M/2 is an odd number, the control unit 10 may be arranged to select k(n+1) according to the flow chart of FIG. 2b, i.e.
if k(n)=1 then k(n+1) is set to M/2+1;
if k(n)≦M/2, k(n)≠1, and k(n) is odd, then k(n+1) is set to k(n)+M/2−1;
if k(n)≦M/2 and k(n) is even, then k(n+1) is set to k(n)+M/2+1;
if k(n)=M then k(n+1) is set to M/2;
if M/2<k(n)<M and k(n) is odd, then k(n+1) is set to k(n)−M/2−1; or
if M/2<k(n)<M and k(n) is even, then k(n+1) is set to k(n)−M/2+1.

The control unit 10 may include a finite state machine comprising a combinational logic block that determines k(n+1) based on k(n). Alternatively, the control unit may include a programmable logic unit, such as a central processing unit (CPU) or a field-programmable gate array (FPGA), programmed to compute k(n+1) based on k(n).

Figure 4:
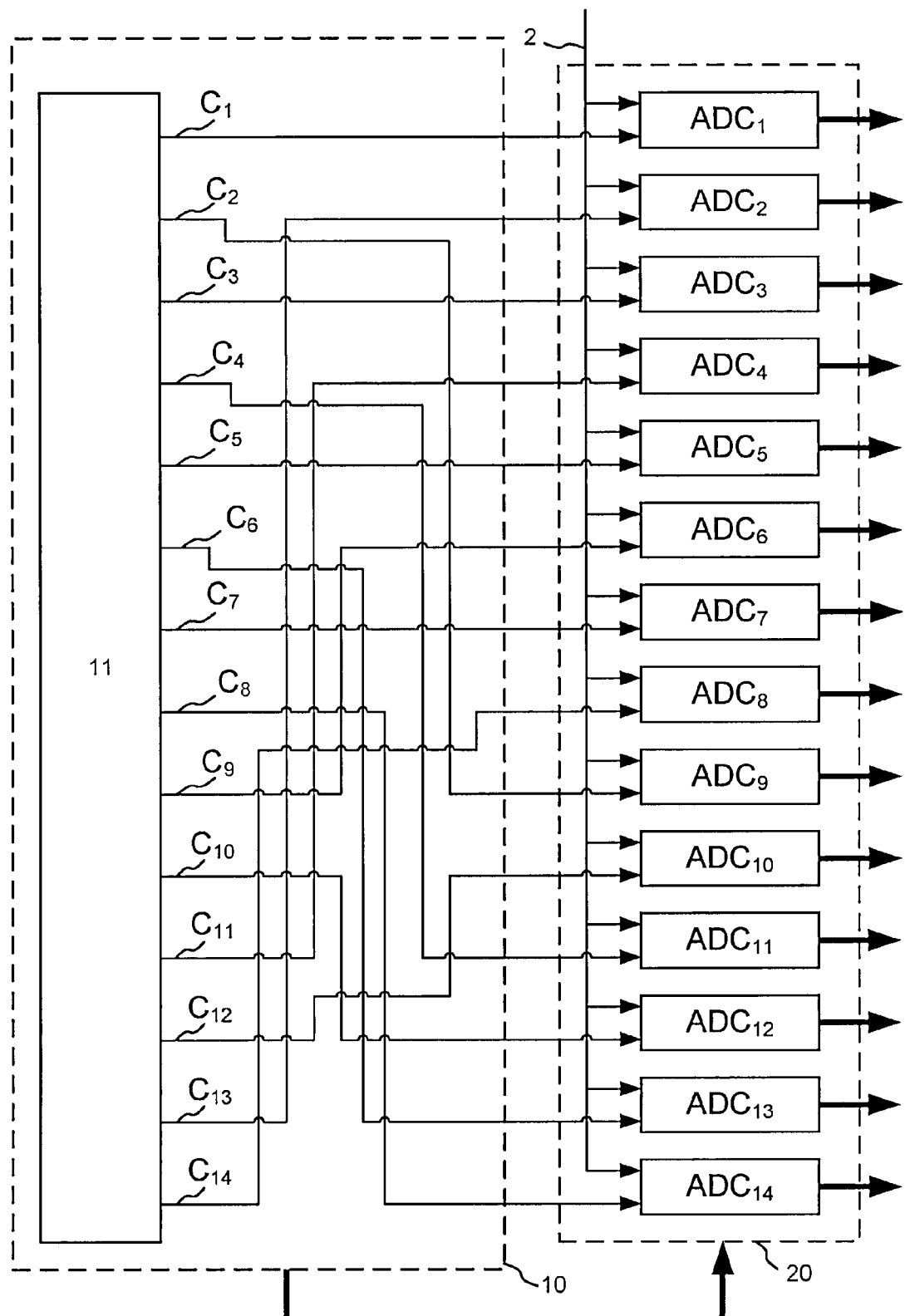
FIG. 4 is a block diagram of an embodiment of a control unit connected to an array of sub ADCs.
Figure 5:
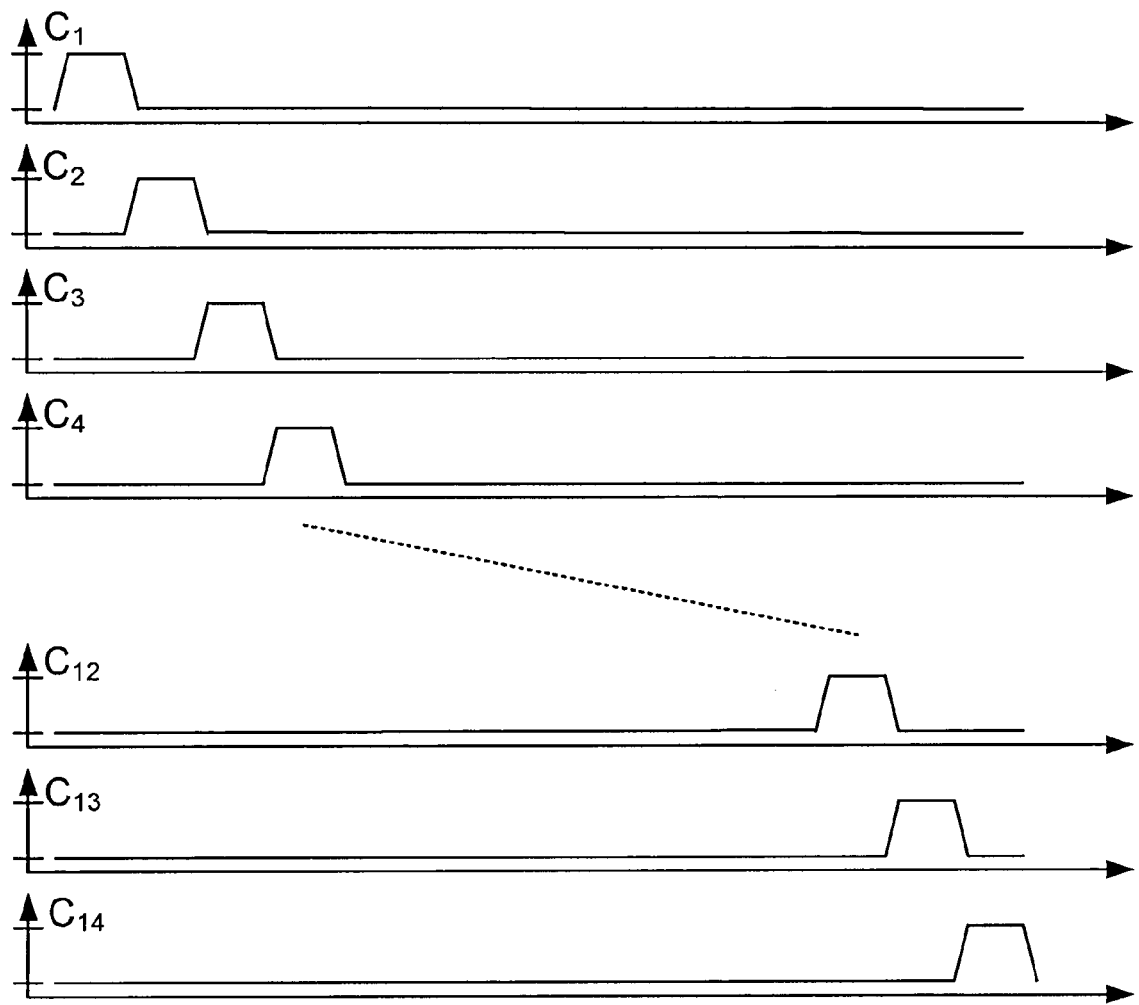
FIG. 5 shows example waveforms for a multi-phase clock unit.

In an alternative embodiment, the control unit may include a multi-phase clock unit (11) having M clock terminals $C_1, \ldots, C_M$ as illustrated with a block diagram in FIG. 4 for M=14. The multi-phase clock unit (11) may be adapted to generate individual clock signals at each of the M clock terminals. Each of the individual clock signals may have the first clock frequency. The individual clock signals may be mutually displaced in time. Examples of waveforms for the individual clock signals are shown in FIG. 5 for M=14. For each waveform in FIG. 5, one cycle of the individual clock signal is shown. Since k(n) is repetitive with a cycle of M samples, the above described functionality of the control unit 10 may be achieved by connecting each of the clock terminals C1, ..., CM to an individual sub ADC $ADC_1, \ldots, ADC_M$ such that the sub ADCs are operated in an order determined e.g. by the sequence k(n) given by the flow chart of FIG. 2a or the sequence k(n) given by the flow chart in FIG. 2b. An example of such a connection in accordance with the flow chart in FIG. 2a is given in FIG. 4 for M=14, wherein $C_1$ is connected to $ADC_1$, $C_2$ is connected to $ADC_9$, $C_3$ is connected to $ADC_3$, $C_4$ is connected to $ADC_{11}$, $C_5$ is connected to $ADC_5$, $C_6$ is connected to $ADC_{13}$, $C_7$ is connected to $ADC_7$, CB is connected to $ADC_{14}$, $C_9$ is connected to $ADC_6$, $C_{10}$ is connected to $ADC_{12}$, $C_{11}$ is connected to $ADC_4$, $C_{12}$ is connected to $ADC_{10}$, $C_{13}$ is connected to $ADC_2$, and $C_{14}$ is connected to $ADC_8$. For example, each sub ADC $ADC_1, \ldots, ADC_M$ may be adapted to sample the analog input signal at an edge, such as a rising edge or a falling edge, of the individual clock signal supplied to it.

The control unit 10 may also include additional circuitry (not shown in FIG. 4), e.g. for generating various control signals for components of the TI-ADC 1, such as the selector unit 30 (FIG. 1).

Figure 6:
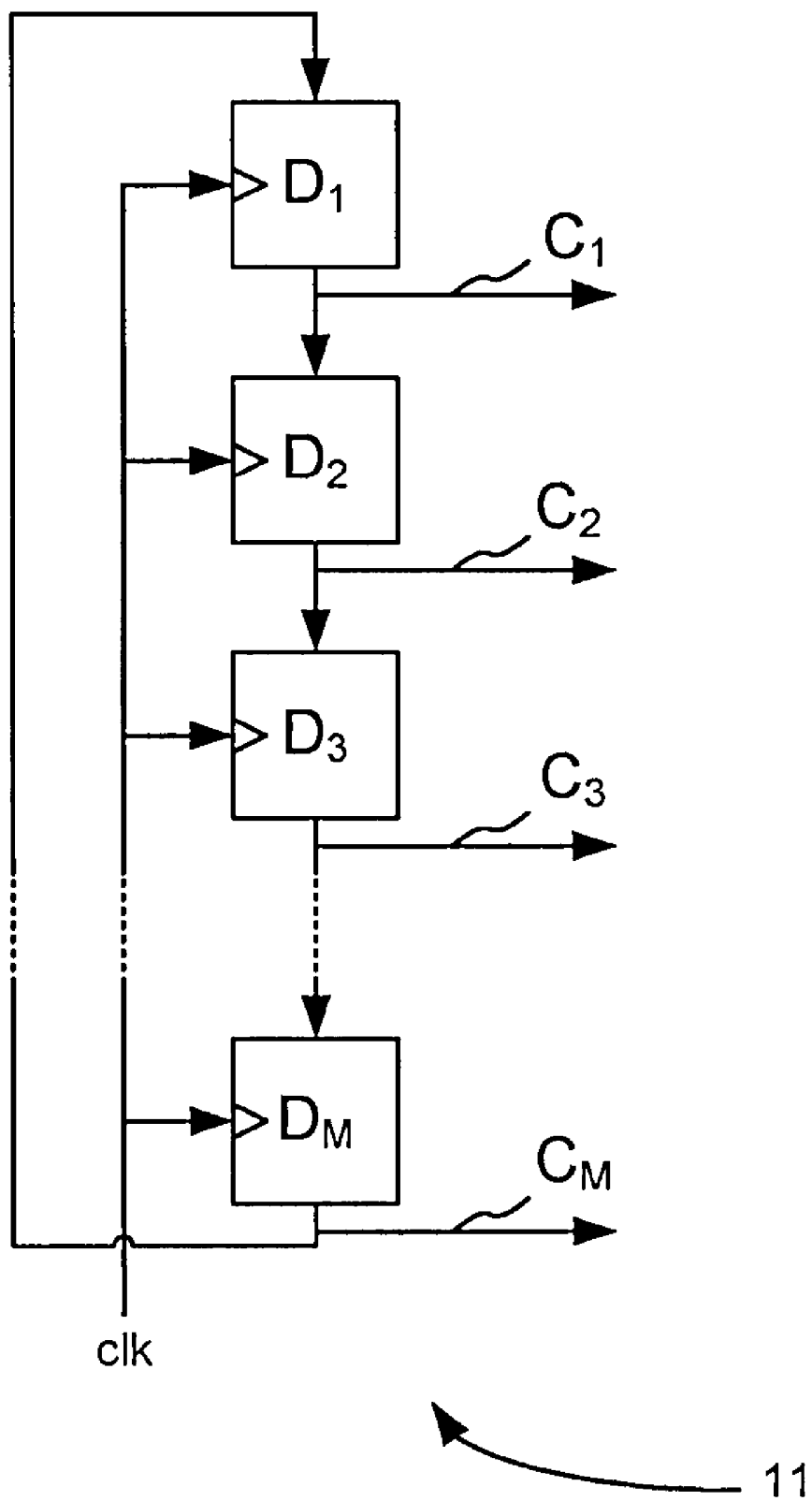
FIG. 6 is a block diagram of an embodiment of a multi-phase clock unit.

The multi-phase clock unit 11 may, e.g., be implemented with a delay-locked loop (DLL). Alternatively, the multi-phase clock unit 11 may be implemented with a plurality of delay elements, such as D flip-flops $D_1, \ldots, D_M$ connected in a ring, as shown in FIG. 6. The D flip-flops $D_1, \ldots, D_M$ may be clocked with a clock signal clk having the second clock frequency. In a start-up phase, the output of one of the D flip-flops $D_1, \ldots, D_M$ may be set to '1', while the outputs of the other D flip-flops $D_1, \ldots, D_M$ are reset to '0'. During operation of the multi-phase clock unit 11, said '1' will be transferred around the ring of D flip-flops so as to generate the individual clock signals at the outputs of the D flip-flops $D_1, \ldots, D_M$. Alternatively, the output of two or more adjacent D flip-flops $D_1, \ldots, D_M$ may be set to '1' during the start-up phase, e.g. to obtain a different duty cycle of the individual clock signals.

The TI-ADC 1 may be comprised in an integrated circuit. The TI-ADC may further be comprised in an electronic apparatus, such as but not limited to a monitor, a projector, a television set, or a radio transceiver.

The invention may be embedded in a computer program product, which enables implementation of the method and functions described herein. The invention may be carried out when the computer program product is loaded an run in a system having computer capabilities. Computer program, software program, program product, or software, in the present context mean any expression, in any programming language, code or notation, of a set of instructions intended to cause a system having a processing capability to perform a particular function directly or after conversion to another language, code or notation.

The present invention has been described above with reference to specific embodiments. However, other embodiments than the above described are possible within the scope of the invention. Different method steps than those described above, performing the method by hardware or software, may be provided within the scope of the invention. The different features and steps of the invention may be combined in other combinations than those described. The scope of the invention is only limited by the appended patent claims.

The invention claimed is:

1. A method for operating a time-interleaved analog-to-digital converter for converting an analog input to a digital output, wherein the time-interleaved analog-to-digital converter comprises an array of M sub ADCs ($ADC_1$, $ADC_2, \ldots, ADC_M$), where M is an even integer, and each row of the array comprises one of the M sub ADCs, wherein
for every sampling instant n, where n is an integer in a sequence of integers, converting the analog input by means of the sub ADC in row k(n) of the array, wherein 1≦k(n)≦M, a value between 1 and M is assigned to k(n) for the first sampling instant, and k(n+1) is selected such that
a) k(n+1)>M/2 if k(n)≦M/2, otherwise k(n+1)≦M/2;
b) M/2−1≦|k(n+1)−k(n)|≦M/2+1; and
c) k(n+1)=k(m+1) if and only if n−m is an integer multiple of M.

2. The method according to claim 1, wherein k(n+1) is chosen according to
if k(n)<M/2 and k(n) is odd, then k(n+1)=k(n)+M/2+1;
if k(n)=M/2 and k(n) is odd, then k(n+1)=M;
if k(n)≦M/2 and k(n) is even, then k(n+1)=k(n)+M/2−1;
if k(n)=M/2+1, then k(n+1)=1;
if k(n)>M/2+1 and k(n)−M/2 is odd, then k(n+1)=k(n)−M/2−1;
if k(n)=M and k(n)−M/2 is even, then k(n+1)=M/2; or
if M/2+1<k(n)<M and k(n)−M/2 is even, then k(n+1)=k(n)−M/2+1.

3. The method according to claim 1, wherein M/2 is an odd number and k(n+1) is chosen according to
if k(n)=1 then k(n+1) is set to M/2+1;
if k(n)≦M/2, k(n)≠1, and k(n) is odd, then k(n+1) is set to k(n)+M/2−1;
if k(n)≦M/2 and k(n) is even, then k(n+1) is set to k(n)+M/2+1;
if k(n)=M then k(n+1) is set to M/2;

if $M/2<k(n)<M$ and $k(n)$ is odd, then $k(n+1)$ is set to $k(n)-M/2-1$; or if $M/2<k(n)<M$ and $k(n)$ is even, then $k(n+1)$ is set to $k(n)-M/2+1$.

4. A computer program product comprising computer program code means for executing the method according to claim 1, when said computer program code means are run by an electronic device having computer capabilities.

5. A computer readable medium having stored thereon a computer program product comprising computer program code means for executing the method according to claim 1, when said computer program code means are run by an electronic device having computer capabilities.

6. A time-interleaved analog-to-digital converter comprising an array of M sub ADCs ($ADC_1, \ldots, ADC_M$), where M is an even integer, wherein each row of the array comprises one of the M sub ADCs ($ADC_1, \ldots, ADC_M$), wherein a control unit arranged to, for every sampling instant n, where n is an integer in a sequence of integers, select the sub ADC in row $k(n)$, $1 \leq k(n) \leq M$, of the array that is used for converting an analog input to a digital output, wherein the control unit is adapted to assign a value between 1 and M to $k(n)$ for the first sampling instant and to, for a given value of $k(n)$, select $k(n+1)$ such that a) $k(n+1)>M/2$ if $k(n) \leq M/2$, otherwise $k(n+1) \leq M/2$;

b) $M/2-1 \leq |k(n+1)-k(n)| \leq M/2+1$; and c) $k(n+1)=k(m+1)$ if and only if n−m is an integer multiple of M.

7. The time-interleaved ADC according to claim 6, wherein the control unit is arranged to select $k(n+1)$ according to if $k(n)<M/2$ and $k(n)$ is odd, then $k(n+1)$ is set to $k(n)+M/2$;

if $k(n)=M/2$ and $k(n)$ is odd, then $k(n+1)$ is set to M;

if $k(n) \leq M/2$ and $k(n)$ is even, then $k(n+1)$ is set to $k(n)+M/2-1$;

if $k(n)=M/2+1$, then $k(n+1)$ is set to 1;

if $k(n)>M/2+1$ and $k(n)-M/2$ is odd, then $k(n+1)$ is set to $k(n)-M/2-1$;

if $k(n)=M$ and $k(n)-M/2$ is even, then $k(n+1)$ is set to M/2; or if $M/2+1<k(n)<M$ and $k(n)-M/2$ is even, then $k(n+1)$ is set to $k(n)-M/2+1$.

8. The time-interleaved ADC according to claim 5, wherein M/2 is an odd number and the control unit is arranged to select $k(n+1)$ according to if $k(n)=1$ then $k(n+1)$ is set to $M/2+1$;

if $k(n) \leq M/2$, $k(n) \neq 1$, and $k(n)$ is odd, then $k(n+1)$ is set to $k(n)+M/2-1$;

if $k(n) \leq M/2$ and $k(n)$ is even, then $k(n+1)$ is set to $k(n)+M/2+1$;

if $k(n)=M$ then $k(n+1)$ is set to M/2;

if $M/2<k(n)<M$ and $k(n)$ is odd, then $k(n+1)$ is set to $k(n)-M/2-1$; or if $M/2<k(n)<M$ and $k(n)$ is even, then $k(n+1)$ is set to $k(n)-M/2+1$.

9. The time-interleaved ADC according to claim 7, wherein the control unit comprises a multi-phase clock unit arranged to generate an individual clock signal at each of a plurality of clock terminals ($C_1, \ldots, C_M$) of the multi-phase clock unit, and wherein each of said plurality of clock terminals ($C_1, \ldots, C_M$) are connected to one of the sub ADCs ($ADC_1, \ldots, ADC_M$).

10. The time-interleaved ADC according to claim 9, wherein the multi-phase clock unit includes a delay-locked loop.

11. The time-interleaved ADC according to claim 9, wherein the multi-phase clock generator includes a plurality of delay elements ($D_1, \ldots, D_M$) connected in a ring.

12. An integrated circuit comprising the time-interleaved ADC according to claim 6.

13. An electronic apparatus comprising the time-interleaved ADC according to claim 6.

14. The electronic apparatus according to claim 13, wherein the electronic apparatus is a monitor, a projector, a television set, or a radio transceiver.

* * * * *